United States Patent
Wu et al.

(10) Patent No.: US 12,305,278 B2
(45) Date of Patent: May 20, 2025

(54) METHOD OF REDUCING TITANIUM NITRIDE ETCHING DURING TUNGSTEN FILM FORMATION

(71) Applicant: Applied Materials, Inc., Santa Clara, CA (US)

(72) Inventors: Kedi Wu, Fremont, CA (US); Chenfei Shen, San Jose, CA (US); Chi-Chou Lin, San Jose, CA (US); Ilanit Fisher, San Jose, CA (US); Shih Chung Chen, Cupertino, CA (US); Mandyam Sriram, San Jose, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 780 days.

(21) Appl. No.: 17/036,209

(22) Filed: Sep. 29, 2020

(65) Prior Publication Data
US 2022/0098731 A1   Mar. 31, 2022

(51) Int. Cl.
*C23C 16/455* (2006.01)
*C23C 16/06* (2006.01)
*C23C 16/34* (2006.01)

(52) U.S. Cl.
CPC ........ *C23C 16/45529* (2013.01); *C23C 16/06* (2013.01); *C23C 16/34* (2013.01); *C23C 16/45553* (2013.01)

(58) Field of Classification Search
CPC ... C23C 16/45529; C23C 16/06; C23C 16/34; C23C 16/45553; C23C 16/0272; C23C 16/08; C23C 16/45534
See application file for complete search history.

(56) References Cited

U.S. PATENT DOCUMENTS

| | | | |
|---|---|---|---|
| 6,482,740 B2 | 11/2002 | Soininen et al. | |
| 6,727,169 B1 | 4/2004 | Raaijmakers | |
| 2006/0009034 A1* | 1/2006 | Lai | H01L 21/76843 257/E21.585 |
| 2006/0216932 A1 | 9/2006 | Kumar et al. | |
| 2010/0216305 A1* | 8/2010 | Wada | H01L 21/28556 257/E21.295 |
| 2011/0263115 A1* | 10/2011 | Ganguli | H01L 21/823814 257/E21.19 |
| 2012/0153381 A1 | 6/2012 | Song | |

(Continued)

FOREIGN PATENT DOCUMENTS

| | | |
|---|---|---|
| KR | 20080060633 A | 7/2008 |
| WO | 2014066792 A1 | 5/2014 |

OTHER PUBLICATIONS

PCT International Search Report and Written Opinion in PCT/US2021/052297 dated Jan. 14, 2022, 10 pages.

(Continued)

*Primary Examiner* — Michael G Miller
(74) *Attorney, Agent, or Firm* — SERVILLA WHITNEY LLC

(57) ABSTRACT

Methods of forming electronic devices comprising tungsten film stacks are provided. Methods include forming a tungsten nucleation layer on the barrier layer using an atomic layer deposition (ALD) process including a tungsten precursor that is free of fluorine. Forming the nucleation layer comprises controlling process parameters and/or forming WSi pre-nucleation layer.

3 Claims, 2 Drawing Sheets

(56) References Cited

U.S. PATENT DOCUMENTS

| | | |
|---|---|---|
| 2014/0120700 A1 | 5/2014 | Wang et al. |
| 2014/0138602 A1 | 5/2014 | Miller et al. |
| 2015/0050807 A1 | 2/2015 | Wu et al. |
| 2015/0275367 A1* | 10/2015 | Moroi ................ C23C 16/4481 427/255.28 |
| 2015/0294975 A1 | 10/2015 | Nakata |
| 2016/0322493 A1 | 11/2016 | Wang et al. |
| 2018/0068904 A1 | 3/2018 | Adusumilli et al. |
| 2018/0138123 A1 | 5/2018 | Liang et al. |
| 2019/0096678 A1 | 3/2019 | Tsai et al. |
| 2019/0157102 A1 | 5/2019 | Jian et al. |

OTHER PUBLICATIONS

PCT International Search Report and Written Opinion in PCT/US2018/061929 dated Mar. 8, 2019, 9 pages.

* cited by examiner

METHOD OF REDUCING TITANIUM NITRIDE ETCHING DURING TUNGSTEN FILM FORMATION

TECHNICAL FIELD

Embodiments of the present disclosure pertain to the field of electronic device manufacturing, and in particular, to integrated circuit (IC) manufacturing. In particular, embodiments of the disclosure are directed to low resistivity tungsten films and methods of manufacturing low resistivity tungsten films.

BACKGROUND

The rapid growth of mobile device, internet of things, and machine learning are demanding greater transistor performance with lower power consumption, which requires continuous development of transistors to follow Moore's Law to shrink the device size and double the density on a chip. Integrated circuits are made possible by processes that produce intricately patterned material layers on substrate surfaces. Producing patterned material on a substrate requires controlled methods for deposition of desired materials. Selectively depositing a film on one surface relative to a different surface is useful for patterning and other applications.

Tungsten deposition based on $WF_6$ has been utilized in the manufacture of integrated circuits, and this method requires a fluorine barrier and a tungsten nucleation layer that have high resistivity. However, these two layers take a significant volume and tend to result in high resistivity which effects overall device performance. In a conventional fill process utilizing a tungsten deposition process, a titanium nitride (TiN) layer is deposited on a dielectric substrate as barrier layer and liner layer, followed by deposition of a nucleation or seed layer of a bulk tungsten (W) film.

Chemical vapor deposition (CVD) is one type of deposition processes employed for depositing layers on a substrate, including tungsten layers. Atomic layer deposition (ALD), which is also referred to as cyclical deposition, employs chemisorption techniques to deliver precursor molecules on a substrate surface in sequential cycles. Each cycle exposes the substrate surface to a first precursor, a purge gas, a second precursor and the purge gas. The first and second precursors react to form a product compound as a film on the substrate surface. The cycle is repeated to form the layer to a desired thickness. The deposition of tungsten films includes the formation of a titanium nitride or other metal barrier layer between the substrate and the tungsten film, and this barrier layer is etched as part of the tungsten nucleation layer deposition process. It has been discovered that in processes that are used for depositing fluorine free tungsten nucleation layers, etching of the barrier layer can cause a problem with voltage tuning (Vt) shift. Therefore, a need exists for improved methods for forming tungsten nucleation layers that reduce etching of the barrier materials such as TiN.

SUMMARY

Methods for depositing metal films are described. In one embodiment, a method of forming a tungsten stack on a substrate comprises forming a barrier layer on a surface of the substrate; forming a tungsten nucleation layer on the barrier layer using an atomic layer deposition (ALD) process including a tungsten precursor that is free of fluorine, wherein the atomic layer deposition process comprises a process pressure, an ALD precursor pulse length of time, a substrate processing temperature and a tungsten precursor temperature prior to delivery of the precursor to an ALD processing chamber; during an ALD process to form the tungsten nucleation layer, controlling the ALD process pressure, the ALD precursor pulse length of time, the substrate processing temperature and the tungsten precursor temperature to reducing etching of the barrier layer; and forming a tungsten film directly on the tungsten nucleation layer.

In another embodiment, a method of forming a tungsten stack on a substrate comprises forming a TiN barrier layer on a surface of the substrate; forming a WSi pre-nucleation layer on the TiN barrier layer by flowing alternating pulses of fluorine free tungsten precursor and a silane; forming a tungsten nucleation layer on the barrier layer using an atomic layer deposition (ALD) process including a tungsten precursor that is free of fluorine, wherein the atomic layer deposition process comprises a process pressure, a precursor pulse length of time, a substrate processing temperature and a tungsten precursor temperature prior to delivery of the precursor to an ALD processing chamber; and forming a tungsten film directly on the tungsten nucleation layer.

In another embodiment, a method of forming a tungsten stack on a substrate comprises forming a TiN barrier layer on a surface of the substrate; forming a tungsten nucleation layer on the TiN barrier layer using an atomic layer deposition (ALD) process including a tungsten precursor that is free of fluorine, wherein the atomic layer deposition process comprises a process pressure, a precursor pulse length of time, a substrate processing temperature and a tungsten precursor temperature prior to delivery of the precursor to an ALD processing chamber; flowing $TiCl_4$ during forming of the tungsten nucleation layer; and forming a tungsten film directly on the tungsten nucleation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
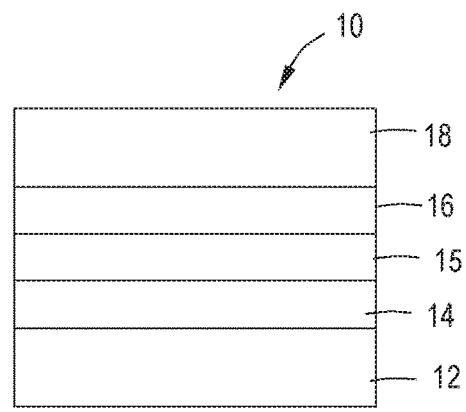
FIG. 1 shows a cross-sectional schematic view of a semiconductor device in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "liner" refers to a layer conformably formed along at least a portion of the sidewalls and/or lower surface of an opening such that a substantial portion of the opening prior to the deposition of the layer remains unfilled after deposition of the layer. In some embodiments, the liner may be formed along the entirety of the sidewalls and lower surface of the opening. A liner may also be formed on a flat surface of a flat substrate.

Advantageously, fluorine-free tungsten (FFW) nucleation layer deposition process has been discovered and provides better nucleation of bulk tungsten growth and also blocks fluorine diffusion. In addition, in specific embodiments, films are produced having low resistivity. The processes described herein include CVD processes and ALD processes. In one or more embodiments, the growth of FFW is based on an etching mechanism of an underlying metal layer such as TiN. In specific embodiments, during etching that occurs during the deposition process for the W nucleation layer, tungsten (W) atoms are adsorbed on nitrogen (N) atoms, and Cl atoms are adsorbed on titanium (Ti) atoms, forming an active layer for titanium nitride (TiN) etching. The presence of hydrogen gas ($H_2$) during the ALD cycles aids in dissociating $WCl_x$ by breaking W—Cl bonds and further facilitating tungsten film growth.

According to one or more embodiments, the methods described herein provide an effective way to reduce barrier layer etching and loss, for example, TiN barrier layer etching and loss, during a tungsten deposition process. In specific embodiments, the methods described herein provide an effective way to reduce barrier layer etching and loss, for example TiN etching and loss during an ALD FFW process. According to one or more embodiments, barrier layer etching loss is reduced by process condition control and pre-deposition treatment. According to one or more embodiments, reduced TiN etching is achieved by lower process pressure, lower substrate support temperature, lower temperature of the precursor container (e.g., an ampoule), and shorter reactant pulse time.

According to one or more embodiments of the process described herein, a WSi pre-nucleation deposition method is utilized to form a protective quasi-layer on a barrier layer (e.g., TiN barrier layer) surface. In specific embodiments, the pre-nucleation deposition method utilizes an ALD process. One or more advantages are achieved according to embodiments described herein. In some embodiments, a method is provided that can be performed in one-chamber for achieving barrier layer etching reduction. In some embodiments, overall throughput time of the process stays constant or is improved compared with existing processes. In one or more embodiments of the methods described herein, the method avoids introducing any impurities into the tungsten film.

According to one or more embodiments, the TiN etching loss is reduced by utilizing a substrate processing chamber (e.g., ALD chamber) pressure in a range of from 15 Torr to 30 Torr. In more specific embodiments, the range of pressure in the substrate processing chamber, such as an ALD chamber, during deposition of the tungsten nucleation layer is in a range of from 20 Torr to 30 Torr, from 21 Torr to 30 Torr, from 22 Torr to 29 Torr, from 23 Torr to 28 Torr, from 24 Torr to 26 Torr, from 25 Torr to 30 Torr, from 26 Torr to 29 Torr, from 27 Torr to 28 Torr, from 27 to 30 Torr, or from 28 Torr to 30 Torr. Reducing the processing chamber pressure reduces barrier layer etching, in particular, TiN barrier layer etching during processing to form the tungsten nucleation layer.

In one or more embodiments, reducing the substrate support (also referred to as the pedestal) temperature during deposition of the tungsten nucleation layer also reduces barrier layer etching, in particular, TiN barrier layer etching during processing. In specific embodiments, the substrate support is maintained within a temperature range of from 400° C. to 475° C., from 410° C. to 470° C., from 420° C. to 465° C. or from 430° C. to 460° C. reduces barrier layer etching, in particular, TiN barrier layer etching during deposition of the tungsten nucleation layer. The substrate temperature can be maintained within the ranged provided herein by heating a substrate support such as a pedestal in an substrate processing chamber such as a CVD chamber or ALD chamber. Resistive heating or other heating of the substrate support can be utilized. In specific embodiments, operating substrate processing chamber with the pressure ranges described herein and maintaining the substrate support during processing within the temperature ranges provided herein reduces barrier layer etching, in particular, TiN barrier layer etching during processing to form the tungsten nucleation layer.

In one or more embodiments, the precursor container for the tungsten precursor, for example, an ampoule, is maintained within a temperature range during tungsten nucleation layer deposition reduces barrier layer etching. In particular, maintaining the precursor container within the temperature range of from 100° C. to 130° C., from 105° C. to 125° C., or from 109° C. to 119° C., reduces TiN barrier layer etching during deposition of the tungsten nucleation layer. In specific embodiments, maintaining the precursor container temperature within the temperature ranges described herein, and operating the substrate processing chamber within the pressure ranges described herein, and maintaining the substrate support during processing within the temperature ranges provided herein reduces barrier layer etching, in particular, TiN barrier layer etching during processing to form the tungsten nucleation layer. The temperature of the precursor container, for example an ampoule can be maintained by placing the precursor container in oven or resistive heating jacket. In one or more embodiments, the length of time of tungsten precursor is pulsed in the chamber during ALD formation of the tungsten layer is maintained within a range of from 0.2 sec to 2.0 sec, from 0.3 to 1.8 sec, from 0.4 to 1.6 sec or from 0.5 sec to 1.5 sec. Maintaining the pulse time within these ranges reduces barrier layer etching, in particular, TiN barrier layer etching during processing to form the tungsten nucleation layer. In specific embodiments, maintaining the length of time of the tungsten precursor pulse within the ranges described herein, and maintaining the precursor container temperature within the temperature ranges described herein, and operating the substrate processing chamber within the pressure ranges described herein, and maintaining the substrate support during processing within the temperature ranges provided herein reduces barrier layer etching, in particular, TiN barrier layer etching during processing to form the tungsten nucleation layer.

In addition to the process tuning of the parameters discussed above, barrier layer etching, in particular, TiN barrier layer etching, can be reduced by forming a WSi pre-nucleation layer on the TIN barrier layer before deposition of the tungsten nucleation layer. In one or more embodiments, the WSi layer is grown by an ALD process using alternating pulses of tungsten precursor such as tungsten chloride or tungsten bromide and silane ($SiH_4$). Experimental results demonstrate that with ten (10) ALD cycles of fluorine-free tungsten precursor and silane, followed by tungsten growth, the TIN etching can be reduced up to 30%. The embodiments described herein provide process conditions that technique to minimize the TiN loss during tungsten nucleation layer deposition. In some embodiments, flowing up to 10 vol % $TiCl_4$, for example, ranges of 0.5-1 vol %, 1-2 vol %, 1-3 vol %, 1-4 vol %, 1-5 vol %, 1-6 vol %, 1-7 vol %, 1-8 vol % 1-9 vol % or 1-10 vol % $TiCl_4$ during tungsten nucleation layer formation reduces etching of the TIN barrier layer.

With reference to FIGS. 1-4, devices and methods for depositing metal films are described. In one embodiment, with reference to FIGS. 1 and 4, a method 200 comprises forming a tungsten stack 10 on a substrate 12. The method comprises at 202 forming a barrier layer 14, for example, a titanium nitride (TiN) barrier layer 14 on a surface of the substrate 12. The method 200 further comprises at 204 optionally forming a pre-nucleation layer 15 on the barrier layer, and at 206 forming a tungsten nucleation layer 16 on either the pre-nucleation layer when present, or on the barrier layer 14 when a pre-nucleation layer 15 is not present. Optionally, at 206, according to some embodiments, at 206, $TiCl_4$ can be flowed during formation of the nucleation layer 16 as described further herein. In one or more embodiments, at 208, the ALD process pressure, precursor pulse length of time, precursor temperature and/or substrate temperature are adjusted. The method 200 of one or more embodiments includes at 210 forming a tungsten film 18 directly on the tungsten nucleation layer 16 using a chemical vapor deposition process or an atomic layer deposition process.

In some embodiments, the substrate surface comprises a feature. In some embodiments, the feature is selected from a trench, a via, or a peak. In specific embodiments, the feature comprises a trench as shown in FIG. 2.

In some embodiments, the trench has a width W of greater than or equal to 5 nm and less than or equal to 65 nm, greater than or equal to 5 nm and less than or equal to 55 nm, greater than or equal to 5 nm and less than or equal to 45 nm, greater than or equal to 5 nm and less than or equal to 35 nm, greater than or equal to 5 nm and less than or equal to 32 nm, greater than or equal to 5 nm and less than or equal to 25 nm, or greater than or equal to 5 nm and less than or equal to 22 nm.

The Figures show substrates having a single feature for illustrative purposes, however, those skilled in the art will understand that there can be more than one feature. The shape of the feature can be any suitable shape including, but not limited to, peaks, trenches and cylindrical vias. In specific embodiments, the feature is a trench. In other specific embodiments, the feature is a via. As used in this regard, the term "feature" means any intentionally-formed surface irregularity. Suitable examples of features include, but are not limited to trenches which have a top, two sidewalls and a bottom, peaks which have a top and two sidewalls extending upward from a surface, and vias which have sidewalls extending down from a surface with an open bottom. Features can have any suitable aspect ratio (ratio of the depth or height H of the feature to the width of the feature). In some embodiments, the aspect ratio is greater than or equal to about 5:1, 10:1, 15:1, 20:1, 25:1, 30:1, 35:1 or 40:1. In one or more embodiments the aspect ratio is greater than 10:1.

Figure 2:
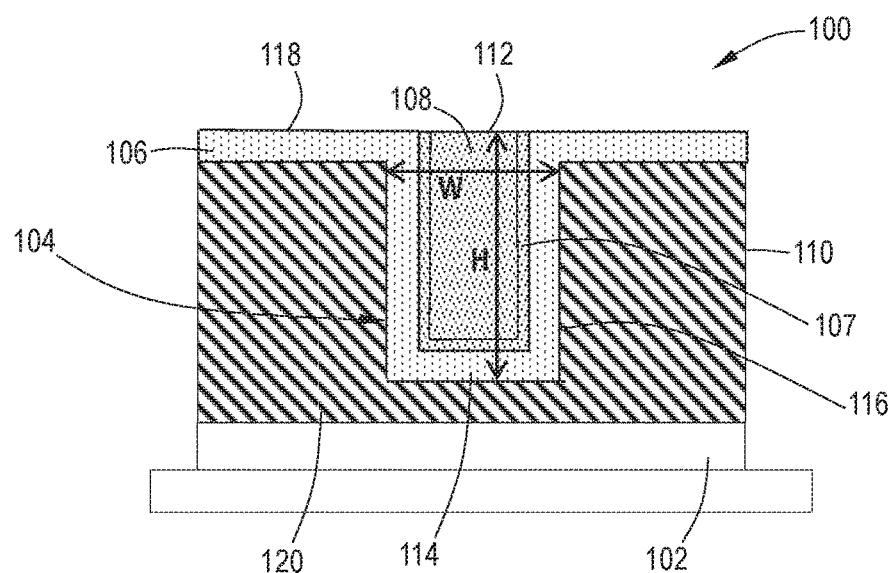
FIG. 2 shows a cross-sectional schematic view of a semiconductor device in accordance with one or more embodiments of the disclosure.
Figure 3:
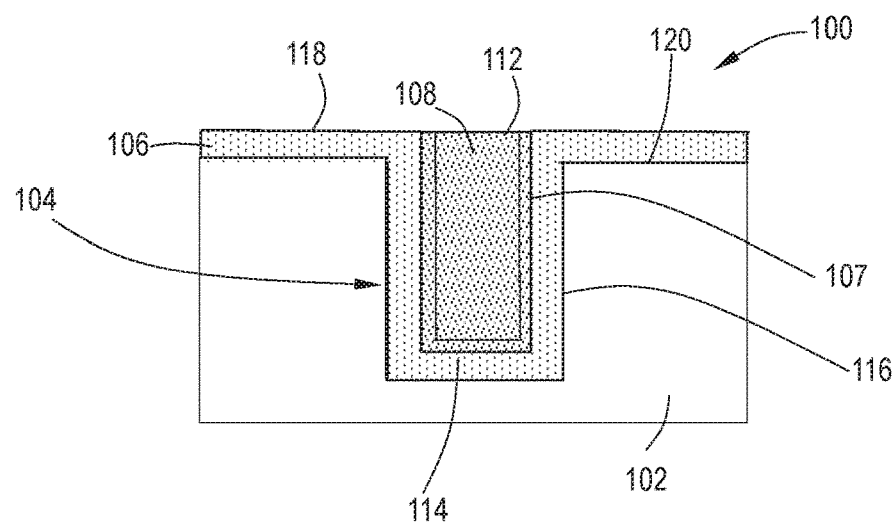
FIG. 3 shows a cross-sectional schematic view of a semiconductor device in accordance with one or more embodiments of the disclosure.
Figure 4:
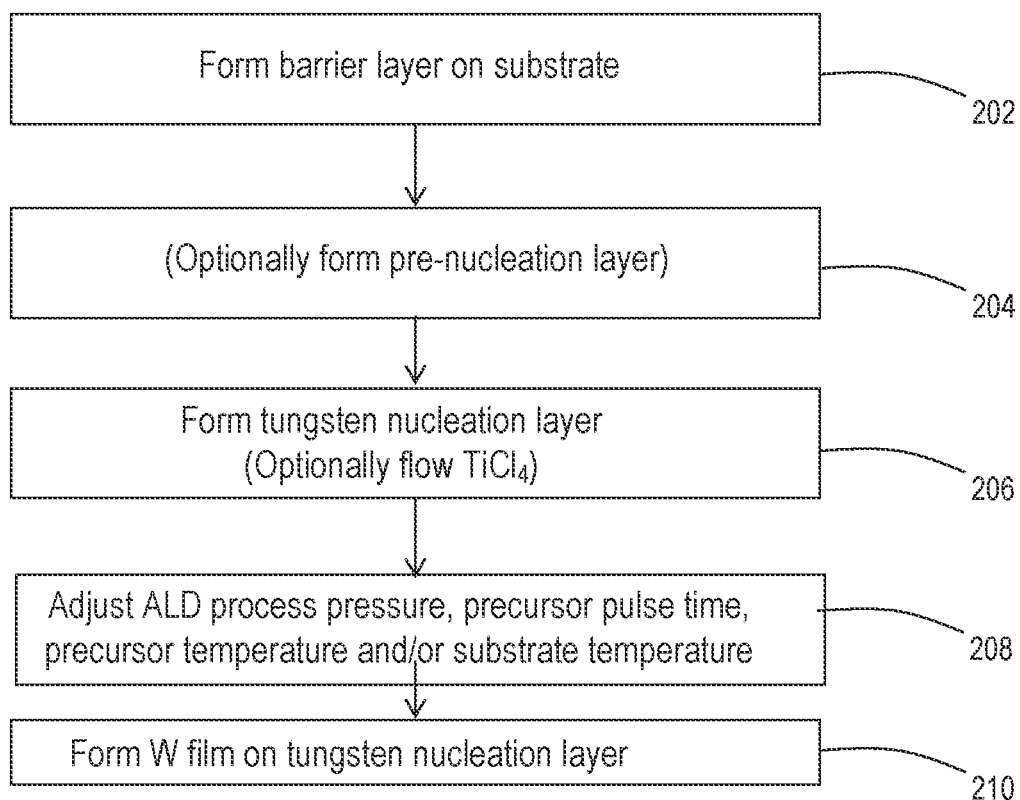
FIG. 4 shows a flowchart of a method according to an embodiment.

With reference to FIGS. 2 and 3, one or more embodiments are directed to methods of forming a semiconductor device 100. A substrate 102 is provided with a feature 104 shown as filled with a tungsten film 108. The feature 104 shown is in the form of a trench having a width W and a depth or height H as described above.

In one or more embodiments the tungsten film 108 is CVD-deposited tungsten film. In one embodiment, the tungsten film is a gapfill layer. As shown in FIG. 2, in one embodiment, tungsten film 108 is deposited on a tungsten nucleation layer 107 on the top portion 114 of the feature 104, the sidewalls 116 of the feature 104 and top portions 118 of a dielectric layer 110. The tungsten nucleation layer 107 is formed on the feature on the barrier layer 106, which in some embodiments is a TiN barrier layer 106.

In one or more embodiments the tungsten film 108 is a seed gapfill layer. In one embodiment, the seed gapfill layer is a selective growth seed film. As shown in FIG. 2, in one embodiment, tungsten film 108 is deposited on a tungsten nucleation layer 107 on the top portion 114 of the feature 104, the sidewalls 116 of the feature 104 and top portions 118 of a dielectric layer 110.

As shown in FIG. 3, in another embodiment, a tungsten film 108 is deposited on a tungsten nucleation layer 107 on the top portion 114 of the feature 104, the sidewalls 116 of the feature 104 and top surface 120 of the substrate 102. The tungsten nucleation layer 107 is formed on a barrier layer 106, which in some embodiments is a TiN barrier layer 106. In one or more embodiments, the tungsten film 108 is a tungsten layer. In one or more embodiment, the tungsten layer is a tungsten gapfill layer.

In one or more embodiments, a dielectric layer 110 is formed on the substrate 102. The dielectric layer can be any suitable dielectric material including, but not limited to, nitride, oxides, or carbides of titanium or silicon. The dielectric layer 110 can be formed conformally on the substrate 102 or non-conformally.

In one embodiment, the dielectric layer 110 includes a dielectric material having a k-value less than 5. In one embodiment, dielectric layer 110 includes a dielectric material having a k-value less than 2. In at least some embodiments, dielectric layer 110 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof. In at least some embodiments, dielectric layer 110 may include polyimide, epoxy, photodefinable materials, such as benzocyclobutene (BCB), and WPR-series materials, or spin-on-glass.

In one embodiment, the thickness of the dielectric layer 110 is in an approximate range from about 10 nanometers (nm) to about 2 microns (μm). In an embodiment, dielectric layer 110 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

One or more embodiments use fluorine-free metal precursors to increase selectivity and deposition rate to form the nucleation layer. Some embodiments incorporate a reducing agent in the first ALD step to increase the selectivity relative to dielectrics and increase the deposition rate with comparable film performance (e.g., step coverage, gap filling). Some embodiments provide high selectivity fluorine-free tungsten deposition with high throughput ALD processes.

Some embodiments of the disclosure provide atomic layer deposition methods incorporating a reducing agent in a first ALD step. Without being bound by any particular theory of operation, it is believed that the inclusion of the reducing agent enables the precursor to thermally decompose into different derivatives of the precursor with significantly greater precursor reduction in the main reducing ALD step.

One or more embodiments of the disclosure incorporate different gases (e.g., $H_2$, $SiH_4$, $Si_2H_6$, $Si_4H_{10}$, $NH_3$) into the metal (e.g., tungsten (W)) precursor dose. In some embodiments, the incorporation of a reducing agent improves the selectivity of the metal deposition relative to dielectrics and accelerates the rate of metal reduction.

ALD Fluorine-Free tungsten in some embodiments replaces and/or reduces traditional high resistivity nucleation layers (e.g., $SiH_4$ or $B_2H_6$ ALD W 20-30 Å) and thick fluorine barrier (e.g., TiN 30-50 Å). In some embodiments, FFW has low resistivity, excellent step coverage, superior fluorine barrier property, and can integrate with conventional $WF_6$ based bulk W fill. Some embodiments improve throughput while maintaining acceptable film performance or other metrics (e.g., non-uniformity, step coverage, particles).

One or more embodiments of the disclosure are directed to methods with high deposition rate FFW films. A small coflow of a reducing agent, like $H_2$, $SiH_4$, $Si_2H_6$, $Si_4H_{12}$, $NH_3$, is added to the W precursor ALD dose step. In some embodiments, the growth of FFW with a hydrogen ($H_2$) coflow by ALD occurs at a suitable temperature (e.g., ranging from 400° C. to 550° C., or form 460° C. to 475° C.).

The tungsten precursor for growing FFW includes, but is not limited to, tungsten chloride and hydrogen as reducing agent. In one or more embodiments, the ALD process includes: exposure to a W precursor dose with 50-500 sccm of $H_2$ coflow, W precursor purge, $H_2$ dose, $H_2$ purge. Argon (Ar) or other suitable inert gas is used for precursor carrier and purging in some embodiments.

In one or more embodiments, the fluorine-free tungsten precursor comprises or consists essentially of a tungsten halide. In some embodiments, the tungsten halide comprises one or more of tungsten pentachloride ($WCl_5$) or tungsten hexachloride ($WCl_6$). In some embodiments, the fluorine-free tungsten precursor comprises a tungsten oxy-halide precursor, such as $WOCl_4$ or $WO_2Cl_2$. In other embodiments, the first process condition comprises a tungsten precursor selected from the group consisting of fluorine free tungsten halide precursors or chlorine-free tungsten halide precursors, such as tungsten pentabromide ($WBr_5$) or tungsten hexabromide ($WBr_6$).

The method of forming the tungsten nucleation layer may further comprise flowing a first reducing agent that is reactive with the tungsten precursor. The first reducing agent (also referred to as a first reductant) comprises a reactive gas, such as a hydrogen-containing gas, such as hydrogen ($H_2$) or ammonia ($NH_3$) or hydrazine $N_2H_4$), and a carrier gas, such as argon (Ar), helium (He), or nitrogen ($N_2$). In some embodiments, the carrier gas is an inert gas. In some embodiments, the first gas consists of, or consists essentially of, a metallic tungsten precursor gas, a reactant gas, and a carrier gas. In some embodiments, the first gas consists of, or consists essentially of a chlorine-free, fluorine-free tungsten halide precursor, a hydrogen containing gas, and an inert gas. In some embodiments, the first reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

The tungsten precursor of some embodiments is flowed into the process region of the processing chamber in a carrier gas. For solid or liquid precursors, the precursors of some embodiments are held in an ampoule and a flow of carrier gas passes through the ampoule and brings precursor along. In some embodiments, the carrier gas comprises an inert gas. In some embodiments, the carrier gas comprises or consists essentially of one or more of helium, neon, argon, nitrogen, krypton or xenon. As used herein, the flow rate of the metal precursor is the flow rate of the carrier gas including the metal precursor.

The total flow into the process region of the processing chamber according to some embodiments is the combined flow rates of the metal precursor and the first reducing agent. In some embodiments, a make-up gas is flowed into the process region and the metal precursor and the first reducing agent are added to the make-up gas flow stream. In some embodiments, the make-up gas flow stream is at a much larger flow rate than either the metal precursor or the first reducing agent. In some embodiments, the make-up gas flow stream has a flow rate greater than 10× the higher of the precursor flow or the first reducing agent flow.

In some embodiments, the flow rates of the tungsten precursor and the first reducing agent are configured to provide a tungsten-containing film substantially free of tungsten metal. In some embodiments, the first reducing agent has a flow rate in the range of 50 to 500 sccm. As will be understood by the skilled artisan, the flow rate of a make-up gas does not change the ratio of the tungsten precursor to the first reducing agent. The make-up gas flow can change the overall concentration of the tungsten precursor and/or the first reducing agent.

In some embodiments, there is a flow rate of the first reducing agent in the range of 5% to 70% of a flow rate of the fluorine-free tungsten precursor. In some embodiments, the fluorine-free tungsten precursor and the first reducing agent have a flow rate ratio in the range of from 10:1 to 1:2.5. Flowing the tungsten precursor and the first reducing agent results in the formation of a first tungsten monolayer of the tungsten nucleation layer In some embodiments, the ALD process used to form the tungsten nucleation layer includes a purge process as part of the ALD process. The purge process can be any suitable purge process that removes unreacted metal precursor or first reducing agent from the process region of the process chamber. In some embodiments, the purge process comprises flowing the same inert gas that is used as the carrier gas for the metal precursor.

In some embodiments, the ALD process includes exposing the first monolayer of the tungsten nucleation layer to a flow of a second reducing agent. In some embodiments, the second reducing agent is the same species as the first reducing agent. In some embodiments, the second reducing agent is a different species as the first reducing agent. The concentration of the second reducing agent can be the same or different from the first reducing agent concentration. In some embodiments, the second reducing agent comprises one or more of hydrogen ($H_2$), silane ($SiH_4$), disilane ($Si_2H_6$), trisilane ($Si_3H_8$), tetrasilane ($Si_4H_{10}$) or ammonia ($NH_3$).

A second purge process can utilized, and the second surge process can be any suitable purge process that removes unreacted metal precursor or first reducing agent from the process region of the process chamber. In some embodiments, the purge process comprises flowing the same inert gas that is used as the carrier gas for the metal precursor. In some embodiments, the purge process comprises flowing the same inert gas as the purge process. In some embodiments, the inert gas used as the carrier gas for the metal precursor, a carrier/diluent gas for the reducing agent (if there is one), the make-up gas and the purge gas comprise the same species.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a tungsten stack on a substrate, the method comprising:
    forming a barrier layer comprising TIN on a surface of the substrate;
    forming a WSi pre-nucleation layer on the barrier layer using an atomic layer deposition (ALD) process comprising ten ALD cycles of flowing alternating pulses of fluorine free tungsten precursor and a silane;
    forming a tungsten nucleation layer on the WSi pre-nucleation layer using an atomic layer deposition (ALD) process including a tungsten precursor that is free of fluorine, wherein the atomic layer deposition process comprises a process pressure, an ALD precursor pulse length of time, a substrate processing temperature and a tungsten precursor temperature prior to delivery of the precursor to an ALD processing chamber;
    during the ALD process to form the tungsten nucleation layer, controlling the ALD process pressure, the ALD precursor pulse length of time, the substrate processing temperature and the tungsten precursor temperature to reduce etching of the barrier layer, wherein the WSi pre-nucleation layer formed by the ten ALD cycles reduces etching of the barrier layer during formation of the nucleation layer; and
    forming a tungsten film directly on the tungsten nucleation layer,
    the method further comprising flowing $TiCl_4$ in range of from 0.5 vol. % to 10 vol % during forming of the tungsten nucleation layer to further reduce etching of the barrier layer.

2. A method of forming a tungsten stack on a substrate, the method comprising:
    forming a barrier layer comprising TIN on a surface of the substrate;
    forming a WSi pre-nucleation layer on the barrier layer using an atomic layer deposition (ALD) process comprising ten ALD cycles of flowing alternating pulses of fluorine free tungsten precursor and a silane;
    forming a tungsten nucleation layer on the WSi pre-nucleation layer using an atomic layer deposition (ALD) process including a tungsten precursor that is free of fluorine, wherein the atomic layer deposition process comprises a process pressure, an ALD precursor pulse length of time, a substrate processing temperature and a tungsten precursor temperature prior to delivery of the precursor to an ALD processing chamber;
    during the ALD process to form the tungsten nucleation layer, controlling the ALD process pressure, the ALD precursor pulse length of time, the substrate processing temperature and the tungsten precursor temperature to reduce etching of the barrier layer, wherein the WSi pre-nucleation layer formed by the ten ALD cycles reduces etching of the barrier layer during formation of the nucleation layer; and
    forming a tungsten film directly on the tungsten nucleation layer,
    wherein tungsten atoms are adsorbed on nitrogen atoms, and Cl atoms are adsorbed on titanium atoms, forming an active layer for titanium nitride etching.

3. The method of claim 2, further comprising flowing hydrogen gas during the ALD process dissociating $WCl_x$ from the barrier layer by breaking W—Cl bonds.

* * * * *